US010361403B2

(12) United States Patent
Langguth et al.

(10) Patent No.: US 10,361,403 B2
(45) Date of Patent: Jul. 23, 2019

(54) FLASH LIGHT ILLUMINATION METHOD AND ORGANIC ELECTRONIC DEVICE ELEMENTS OBTAINABLE THIS WAY

(71) Applicant: Novaled GmbH, Dresden (DE)

(72) Inventors: Oliver Langguth, Dresden (DE); Tobias Canzler, Dresden (DE)

(73) Assignee: Novaled GmbH, Dresden (DE)

( * ) Notice: Subject to any disclaimer, the term of this patent is extended or adjusted under 35 U.S.C. 154(b) by 28 days.

(21) Appl. No.: 15/839,188

(22) Filed: Dec. 12, 2017

(65) Prior Publication Data

US 2018/0166656 A1 Jun. 14, 2018

(30) Foreign Application Priority Data

Dec. 13, 2016 (EP) .................................... 16203671

(51) Int. Cl.
*H01L 51/56* (2006.01)
*H01L 27/32* (2006.01)
(Continued)

(52) U.S. Cl.
CPC ............ *H01L 51/56* (2013.01); *H01L 27/322* (2013.01); *H01L 27/3246* (2013.01);
(Continued)

(58) Field of Classification Search
None
See application file for complete search history.

(56) References Cited

U.S. PATENT DOCUMENTS

2005/0247946 A1* 11/2005 Shin .................... H01L 51/5218
257/88
2008/0100204 A1* 5/2008 Kim ..................... C23C 14/042
313/504

(Continued)

FOREIGN PATENT DOCUMENTS

JP 2008-109003 A 5/2008
WO 2014/038141 A2 3/2014

OTHER PUBLICATIONS

EP Search Report for EP Application No. 16203671 dated Jun. 27, 2017 (7 pages).

*Primary Examiner* — Michelle Mandala
*Assistant Examiner* — Jordan M Klein
(74) *Attorney, Agent, or Firm* — Eversheds Sutherland (US) LLP

(57) ABSTRACT

The present invention relates to a method comprising the steps: a) providing a layered structure applicable for preparing an organic electronic device, comprising: aa) a substrate comprising a first electrode structure and a non-electrode part; bb) a grid formed by a grid material, wherein open areas of the grid are arranged above at least a part of the first electrode structure and the grid material is arranged above at least a part of the non-electrode part; and cc) a layer stack comprising at least one redox-doped layer having a conductivity of at least 1E−7 S/cm, the layer stack being deposited on the grid; wherein the optical density measured by absorption spectroscopy of the grid material is higher than the optical density of the open areas; and b) irradiating light pulses having a duration of <10 ms and an energy of 0.1 to 20 J/cm² per pulse, alternatively 1 to 10 J/cm², onto the layered structure; an organic electronic device obtainable this way and a device comprising said organic electronic device.

20 Claims, 4 Drawing Sheets

Figure 1:
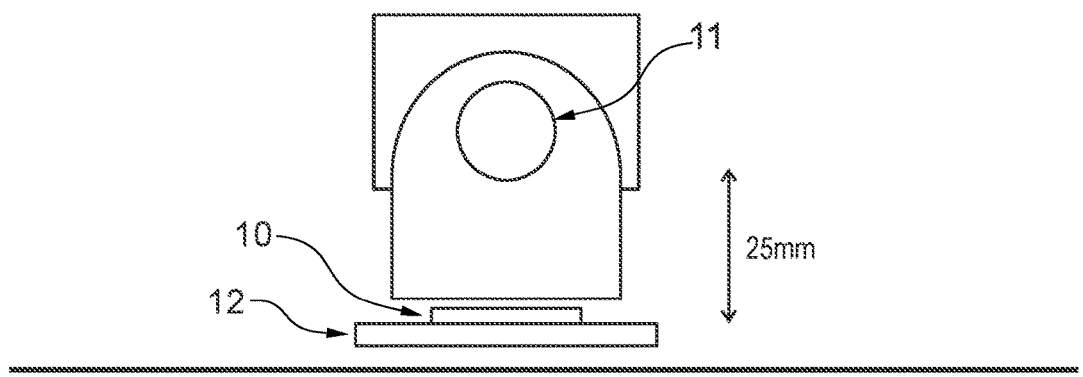

(51) Int. Cl.
*H01L 51/52* (2006.01)
*H01L 51/00* (2006.01)
*H01L 51/05* (2006.01)
*H01L 51/42* (2006.01)
*H01L 51/50* (2006.01)

(52) U.S. Cl.
CPC ...... *H01L 27/3279* (2013.01); *H01L 51/0015* (2013.01); *H01L 51/5243* (2013.01); *H01L 27/3283* (2013.01); *H01L 51/0504* (2013.01); *H01L 51/42* (2013.01); *H01L 51/5088* (2013.01); *Y02E 10/549* (2013.01)

(56) References Cited

U.S. PATENT DOCUMENTS

2012/0270460 A1* 10/2012 Miyazawa ............... H01L 51/56
                                                                             445/2
2015/0069361 A1* 3/2015 Sato ................... H01L 27/3279
                                                                             257/40

* cited by examiner

FLASH LIGHT ILLUMINATION METHOD AND ORGANIC ELECTRONIC DEVICE ELEMENTS OBTAINABLE THIS WAY

CROSS REFERENCE TO RELATED APPLICATIONS

This application claims priority to European Application No. 16203671.9, filed Dec. 13, 2016, which is hereby incorporated by reference.

The present invention relates to a method of using flash light illumination to prepare organic electronic devices.

In electronics, crosstalk is a phenomenon by which a signal transmitted on one circuit or device creates an undesired effect in another circuit or device. Crosstalk is usually caused by undesired capacitive, inductive or conductive coupling from one circuit or device element, or part of a circuit or device element, to another. Electronic equipment having very low distances between circuits or device elements like high-resolution display screens, high resolution active matrix organic electronic diode (AMOLED) displays or thin-film transistor (TFT) arrays, photodetector arrays and image sensors the role of cross-talk is particularly prominent. The root cause is usually a conductive path between neighboring circuits or device elements brought about by common conductive layers or materials used in the device array.

For example, common conductive layers may be charge injection layers on the electrodes of the display OLEDs or conductive layers in charge generation layers (CGLs) in display OLEDs. Such conductive injection layer can be shared between several, if not all, OLEDs in the pixels of a display and is therefore called a "common" layer. Thus, an electrical current can flow through the conductive layer from an addressed pixel to adjacent pixels which are not addressed. This causes the undesired effect that the adjacent pixels light up although they are not switched on. The conductive layers in display OLEDs are normally redox-doped charge transport layers.

DESCRIPTION OF RELATED PRIOR ART

Several methods to reduce cross-talk are described in the related prior art. For example, OLED displays are produced industrially on large scale by vacuum deposition of organic functional materials, most commonly the emissive layer, through fine-metal masks (FMM) onto common conductive layers or charge transport layers (US2008100204). FMM might be applied to separate all functional organic layers in OLEDs of a display device, which may reduce the likelihood of electrical cross-talk to occur. Other methods of spatially separating circuit or device elements are micro- and nano-patterning techniques as described in Menard et al. Chem. Rev. 2007, 107, 1117-1160 "Micro- and Nanopatterning Techniques for Organic Electronic and Optoelectronic Systems". These methods have the disadvantage of being expensive and time-consuming.

Reducing the thickness of the common conductive layers to a minimum of <10 nm can reduce the cross-talk phenomenon but is often at the expense of device performance. So is the reduction of the doping concentration considerably below 1 wt %. Another option is the increase of distance between the circuits or device elements. However, this is contradicting the electronics industry's ambition for higher device density and resolution.

Scanning beam methods may be used to selectively annihilate common conductive layers between neighboring circuits or device elements. Especially for large area applications these techniques are too time-consuming.

SUMMARY OF INVENTION

Therefore, it is, in light of the prior art, the object of the present invention to provide a method for preparing an organic electronic device as well as respective organic electronic devices which may be constituted of an array of neighboring circuits or device elements overcoming drawbacks of the prior art. In particular, a method for preparing an organic electronic device shall be provided for avoiding electrical cross-talk between neighboring electrode areas comprised in the organic electronic device. The method shall be inexpensive, not time-consuming and suitable to obtain excellent device performance.

This object has first of all been achieved by a method comprising the steps:
a) providing a layered structure applicable for preparing an organic electronic device, comprising:
   aa) a substrate comprising a first electrode structure and a non-electrode part;
   bb) a grid formed by a grid material, wherein open areas of the grid, are arranged above at least a part of the first electrode structure and the grid material is arranged above at least a part of the non-electrode part; and
   cc) a layer stack comprising at least one redox-doped layer having a conductivity of at least 1E−7 S/cm, the layer stack being deposited on the grid;
   wherein the optical density measured by absorption spectroscopy of the grid material is higher than the optical density of the open areas; and
b) irradiating light pulses having a duration of <10 ms, alternatively 0.1 to 10 ms, and an energy of 0.1 to 20 $J/cm^2$ per pulse, alternatively 1 to 10 $J/cm^2$, onto the layered structure.

The inventive "layered structure applicable for preparing an organic electronic device" shall be understood as a part of a respective layered organic electronic device known in the art. According to the disclosure, the layered structure comprises a substrate, a first electrode structure, a grid and a layer stack.

In an embodiment the substrate may be a glass or plastic substrate, for example described in US2005247946.

In another embodiment the substrate may be a silicon thin-film transistor (TFT) backplane, or poly-silicon backplane, such as provided by Samsung SDI of Yongin-City, Kyonggi-do, Korea; or by AU Optronics Corp. of Taiwan.

In a further embodiment the first electrode structure may be a pixel electrode, for example described in US2005247946.

In an embodiment the first electrode may be a cathode, an anode, a source electrode, a drain electrode or a gate electrode.

In another embodiment the layer stack constitutes an OLED, for example described in US2005247946.

In an embodiment the grid material comprises an organic polymer.

In a further embodiment the grid material comprises an inorganic compound, wherein the inorganic compound may be a metal compound.

In one embodiment the grid material is a metal or metal alloy.

In another embodiment the grid material is a composite material comprising organic and inorganic compounds.

In another embodiment the grid material is a composite material comprising and organic compound and at least one metal.

The layer stack may, besides the at least one redox-doped layer, comprise further layers well known in the art to be suitable to constitute organic electronic devices. However, in another embodiment, the layer stack may only consist of the redox-doped layer. Further layers of the layer stack may in this embodiment be deposited on the redox-doped layer after finishing of the irradiating step. The layered structure is applicable for preparing the respective organic electronic devices in a way that the layered structure may be combined with further elements, in particular further layers, a further electrode, an encapsulation or any other element known in the art to be suitable to form an organic electronic device.

The substrate comprises a first electrode structure. The first electrode structure may be comprised in the substrate in that it is incorporated therein or deposited on the top thereof as long as it is provided that direct electrical contact between the first electrode structure and the layer stack is ensured.

In an embodiment the first electrode structure is an anode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode. The anode electrode may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

In another embodiment the first electrode is a cathode. The cathode electrode comprises at least one substantially metallic cathode layer comprising a first zero-valent metal selected from the group consisting of alkali metal, alkaline earth metal, rare earth metal, group 3 transition metal and mixtures thereof.

The term "substantially metallic" shall be understood as encompassing a metal which is at least partially in a substantially elemental form. The term substantially elemental is to be understood as a form that is, in terms of electronic states and energies and in terms of chemical bonds of comprised metals atoms closer to the form of an elemental metal, or a free metal atom or to the form of a cluster of metal atoms, then to the form of a metal salt, of an organometallic metal compound or another compound comprising a covalent bond between metal and non-metal, or to the form of a coordination compound of a metal. It is to be understood that metal alloys represent beside neat elemental metals, atomized metals, metal molecules and metal clusters, any other example of substantially elemental form of metals.

According to another aspect the substantially metallic cathode layer is free of a metal halide and/or free of a metal organic complex.

In an embodiment the first electrode structure is transparent. The first electrode structure may be arranged on top of the substrate or may be incorporated into the substrate.

The grid is formed by interconnected parts made of the grid material. The grid material may be a solid material. The structure of interconnected parts encloses a variety of open areas. The open areas are arranged above at least a part of the first electrode structure. They may be arranged above the entire first electrode structure. The open areas are characterized by not comprising any of the grid material. This is to allow direct contact of the first electrode with the layer stack arranged on the grid. The layer stack may be arranged on the grid covering open areas as well as interconnected parts (ie. the grid material).

The bottom side of the grid may be in direct contact with the substrate. The parts of the grid other than the bottom side may be in direct contact with the layer stack.

The layer stack may be in direct contact with the first electrode and with the grid material.

In an embodiment there may be an interlayer between the layer stack and the first electrode. The interlayer may be a surface region of the first electrode with modified surface properties.

In another embodiment there may be an interlayer between the grid and the substrate. The interlayer may be a surface region of the grid or the substrate with modified surface properties.

In another embodiment there may be an interlayer between the layer stack and the grid material. The interlayer may be a surface region of the grid with modified surface properties.

The individual layers in the layer stack may be closed layers.

In an embodiment individual layers in the layer stack may be non-closed layers in the sense that the individual layers in the layer stack may be arranged only above the first electrode or the individual layers in the layer stack may be arranged only above the grid material.

In another embodiment the grid material may be surface treated to modify the surface properties of the grid material. The surface treatment may be a plasma treatment. In a further embodiment at least one of the layers in the layer stack is deposited only in the open areas by using a mask that covers the interconnected parts of the grid.

The interconnected parts (i.e. the grid material) are arranged above at least a part of the non-electrode part of the substrate. The interconnected parts may be arranged above the entire non-electrode part of the substrate.

In an embodiment the interconnected parts of the grid may constitute a pixel definition layer exposing the first electrode structure as described in US2005247946.

The inventive layer stack comprises at least one redox-doped layer. The redox-doped layer does not contain an emitter dopant. A redox-doped layer in terms of the disclosure has a conductivity of ≥1E-7 S/cm. The conductivity may be measured by a parameter analyzer Keithley 4200A-SCS as provided by Tektronix, Beaverton, USA. The redox-doped layer may be arranged at the bottom or top of the layer stack or may be a layer inside the layer stack.

In one embodiment the at least one redox-doped layer consists of a redox-dopant.

In another embodiment the at least one redox-doped layer may comprise a redox-dopant and a matrix material which may be an organic matrix material.

The matrix material may be a charge transport material.

In a further embodiment the at least one redox-doped layer is a double layer consisting of a first layer consisting of an injection material and a second layer consisting of a charge transport material, which may be redox-doped or undoped.

In another embodiment a multiple of redox-doped layers are in direct contact with each other.

In another embodiment neighboring redox-doped layers are separated by an interlayer having a thickness of about 0.5 to about 10 nm. The interlayer may be organic or inorganic.

In a further embodiment the interlayer may consist of a metal, a metal complex, a metal salt or a mixture thereof.

In a further embodiment the interlayer may consist of an organic charge transport material.

Besides the redox-doped layer, the layer stack may comprise further layers known in the art to be suitable to form an organic electronic device. The sequence, the type and the number of the individual layers in the layer stack are not particularly defined or limited.

In an embodiment the layer stack may comprise one or several layers selected from the group of:

Hole-injection layer (HIL). Examples of compounds that may be used to form the HIL include a phthalocyanine compound, such as copper phthalocyanine (CuPc), 4,4',4"-tris (3-methylphenylphenylamino) tri-phenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS). The HIL may be a layer consisting of a p-type dopant or may be selected from a hole-transporting matrix compound redox-doped doped with a p-type dopant. Typical examples of known redox-doped hole transport materials are: copper phthalocyanine (CuPc) doped with tetrafluorotetracyanoquinonedimethane (F4TCNQ), zinc phthalocyanine (ZnPc) doped with F4TCNQ, α-NPD (N,N'-Bis(naphthalen-1-yl)-N,N'-bis(phenyl)-benzidine) doped with F4TCNQ, α-NPD doped with 2,2'-(perfluoronaphthalen-2,6-diylidene) dimalononitrile, α-NPD doped with 2,2',2"-(cyclopropane-1,2,3-triylidene)tris(2-(p-cyanotetrafluorophenyl)acetonitrile). Dopant concentrations may be selected from 1 to 20 wt.-%, alternatively from 3 wt.-% to 10 wt.-%.

Hole-transport layer (HTL). The HTL may be formed of any compound that is commonly used to form an HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzydine (alpha-NPD); and a triphenylamine-based compound, such as 4,4',4"-tris (N-carbazolyl)triphenylamine (TCTA).

Electron blocking layer (EBL). Typically, the EBL comprises a triarylamine or a carbazole compound. If the electron blocking layer has a high triplet level, it may also be described as triplet control layer. The function of the triplet control layer is to reduce quenching of triplets if a phosphorescent green or blue emission layer is used. Thereby, higher efficiency of light emission from a phosphorescent emission layer can be achieved in an OLED device. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1.

Emission layer (EML). The EML is commonly used in OLED and may be a combination of a host and an emitter dopant. The emitter dopant largely controls the emission spectrum of an EML. Examples of the host are Alq3, 4,4'-N,N'-dicarbazole-biphenyl (CBP), poly(nvinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tertbutyl-9,10-di-2-naphthylanthracenee (TBADN), distyrylarylene (DSA), Bis(2-(2-hydroxyphenyl)benzothiazolate), zinc (Zn(BTZ) 2). The emitter dopant may be a phosphorescent or fluorescent emitter. Phosphorescent emitters and emitters which emit light via a thermally activated delayed fluorescence (TADF) mechanism may be used due to their higher efficiency. The emitter dopant may be a small molecule or a polymer. Examples of a red emitter dopant are PtOEP, Ir(piq)$_3$, and Btp$_2$Ir(acac), but are not limited thereto. These compounds are phosphorescent emitters, however, fluorescent red emitter dopants could also be used.

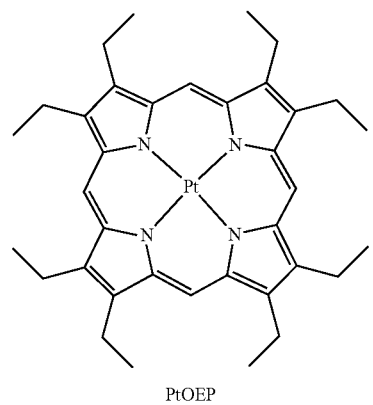

PtOEP

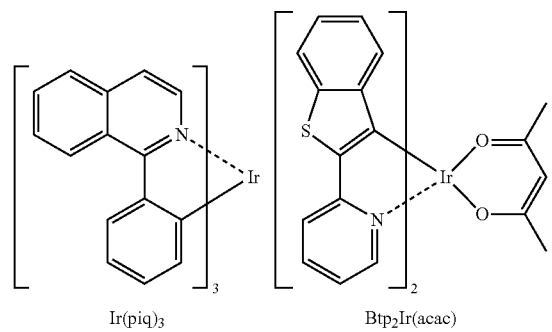

Ir(piq)$_3$      Btp$_2$Ir(acac)

Examples of a phosphorescent green emitter dopant are Ir(ppy)$_3$ (ppy=phenylpyridine), Ir(ppy)$_2$(acac), Ir(mpyp)$_3$ are shown below.

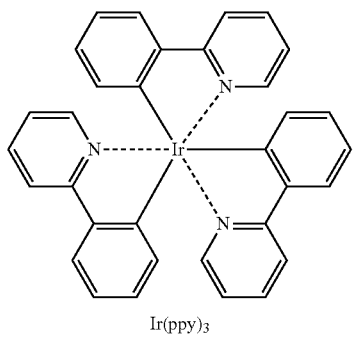

Ir(ppy)$_3$

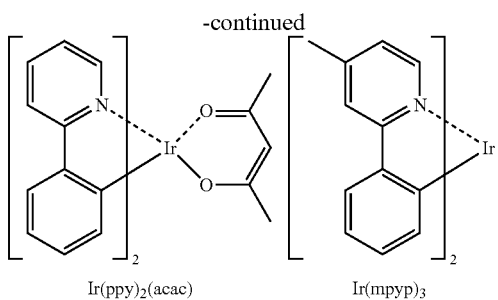

Ir(ppy)₂(acac)    Ir(mpyp)₃

Examples of a phosphorescent blue emitter dopant are F₂Irpic, (F₂ppy)₂Ir(tmd) and Ir(dfppz)₃, terfluorene, the structures are shown below. 4.4'-bis(4-diphenyl amiostyryl) biphenyl (DPAVBi),2,5,8,11-tetra-tert-butyl perylene (TBPe) are examples of fluorescent blue emitter dopants.

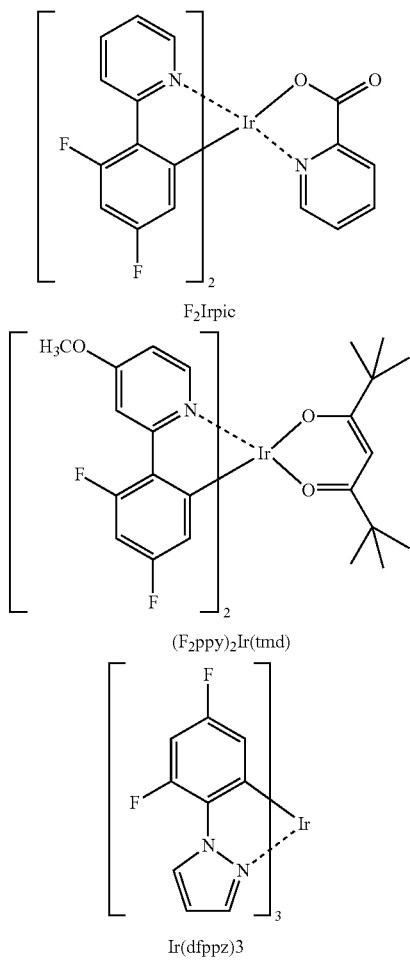

F₂Irpic (F₂ppy)₂Ir(tmd)

Ir(dfppz)3

Hole-blocking layer (HBL). Any compound that is commonly used to form a HBL may be used. Examples of compounds for forming the HBL include an oxadiazole derivative, a tria-zole derivative, and a phenanthroline derivative.

Electron transport layer (ETL). The ETL may comprise matrix compounds and additives or n-type dopants. The matrix compounds may be selected from the group of benzo[k]fluoranthene, pyrene, anthracene, fluorene, spiro (bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, phenyltriazole, benzimidazole, phenanthroline, oxadiazole, benzooxazole, oxazole, quinazoline, ben-zo[h]quinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, dithienothiophene, benzothienopyrimidine, benzothienopyrimidine, phosphine oxide, phosphole, triaryl borane, 2-(benzo[d]oxazol-2-yl)phenoxy metal complex, 2-(benzo[d]thiazol-2-yl)phenoxy metal complex or mixtures thereof. The additives or n-type dopants may be selected from the group of metal, metal complex, metal halide, guanidine or phosphine-imine, acridine orange base (AOB); tetrakis (1,3,4,6,7,8 hexahydro-2H pyrimido [1,2-a] pyrimidinato) ditungsten (II) (W₂(hpp)₄); 3,6-bis-(dimethyl amino)-acridine; bis(ethylene-dithio) tetrathiafulvalene (BEDT-TTF); oxocarbon; pseudooxocarbonderivatives.

Electron injection layer (EIL). The EIL may comprise alkali, alkaline earth or rare earth metals or complexes or salts of alkali, alkaline earth or rare earth metals. The EIL may comprise an organic matrix compound selected from the group of phosphine oxides, diphenylphosphine oxides, benzimidazoles, phenanthrolines, quinazolines, benzo[h]quinazolines, pyrido[3,2-h]quinazolines. The EIL may comprise additives or n-type dopants. The additives or n-type dopants may be selected from the group of metal, metal complex, metal halide, guanidine or phosphine-imine, acridine orange base (AOB); tetrakis (1,3,4,6,7,8-hexahydro-2H-pyrimido [1,2-a] pyrimidinato) ditungsten (II) (W2(hpp) 4); 3,6-bis-(dimethyl amino)-acridine; bis(ethylene-dithio) tetrathiafulvalene (BEDT-TTF); oxocarbon; pseudooxocarbonderivatives.

Charge generation layer (CGL). The CGL is described in US 2012098012 A for use in OLED but may be used in other electronic devices. The CGL is generally composed of a double layer wherein the two layers of the double layer CGL may be separated by an interlayer having a thickness of about 0.5 to about 10 nm. The material of the interlayer may be a metal, a metal complex, a metal salt or an organic compound.

The CGL can be a pn junction CGL joining p-type CGL and n-type CGL. The p-type CGL can be composed of metal or organic host material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host material can employ conventional materials. For example, the p-type dopant can be one selected from a group consisting of tetrafluore-7,7,8,8-tetracyanoquinodimethane (F4-TCNQ), derivative of tetracyanoquinodimethane, radialene derivative, iodine, FeCl₃, FeF₃, and SbCl₅. The host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB). The n-type charge generation layer can be composed of metal or organic material doped with n-type dopant. The metal can be one selected from a group consisting of Li, Na, K, Rb, Cs, Mg, Ca, Sr, Ba, La, Ce, Sm, Eu, Tb, Dy, and Yb. Also, n-type dopant and host material can employ conventional materials. For example, the n-type dopant can be alkali metal, alkali metal compound, alkali earth metal, or alkali earth metal compound. More specifically, the n-type dopant may be selected from a group consisting of Cs, K, Rb, Mg, Na, Ca, Sr, Eu and Yb. The n-type dopants may also be selected from the group of metal complex, metal halide, guanidine or phosphine-imine, acridine orange base (AOB); tetrakis (1,3,4,6,7,8-hexahydro-2H-pyrimido [1,2-a] pyrimidinato) ditungsten (II) (W2(hpp)4); 3,6-bis-(dimethyl amino)-acridine; bis(ethylene-dithio) tetrathiafulvalene (BEDT-TTF); oxocarbon; pseudooxocarbonderivatives. The host material can be one selected from a group consisting of tris(8-hydroxyquinoline)aluminum, triazine, hydroxyquinoline derivative, benzazole derivative, and silole derivative.

A light absorption layer. The light absorption layer may be a single layer or a flat heterojunction double layer or a bulk-hetrojunction layer as used in solar cell devices. The light absorbing layer comprises at least one absorber compound. The flat hetero-junction double layer and the bulk-hetrojunction layer may comprise an electron acceptor material like fullerene C60 and an electron-donor material like P3HT. The light absorption layer may comprise a material crystallizing in the perovskite structure having a stoichiometry of $AMX_3$ or $A_2MX_4$, where "A" and "M" are cations and "X" is an anion. The light absorbing layer may be the photoelectric conversion layer of a photosensor.

A dielectric layer. The dielectric layer may be used in transistor devices and comprises a dielectric material that is a substance that is a poor conductor of electricity, but an efficient supporter of electrostatic field. The dielectric material may be an organic or inorganic. Inorganic dielectric materials may be oxides and nitrides. The inorganic materials may be selected from the group of $SiO_2$, $Ta_2O_5$, $Al_2O_3$, $SiN_x$. The organic dielectric materials may be selected from the group of polyvinylpyrrolidone, polymethylmethacrylate, polyimide, polytetrafluorethylene, polyperfluoroalkenylvinylether, polychloro pyrene, polyethylene terephthalate, polyoxymethylene, polyvinylchloride, polyvinylidene fluoride, polyvinylphenol, poly sulfone, polycarbonate, or any type of photoresist used in lithography A semiconductor layer. P-type semiconductors for the semiconducting layer may be: pentacene, dinaphthothieno-thiophene (DNTT), further DNTT derivatives such as C10-DNTT (in general Cx-DNTT), Metal-Phthalocyanines (ZnPc,CuPc), perylenes such as Diindenoperylenes (DIP), Tetrapropyl-tetraphenyl-diindenoperylene (P4-PH4-DIP). N-type semiconductors for the semiconducting layer may be: C60, C70, ZnPc, CuPc, F16CuPc, F4CuPc, Diindenoperylenes (DIP). Also be tri-phenyl-diamine (TPD), 3-(NMa-leimidopropionyl)-biocytin (MPB), Bathophenanthroline (BPHEN), 2,4,7,9-tetraphenyl-1,10-phenanthroline (TPHEN), perylene-3,4,9,10-tetracarboxylie-3,4,9,10-dianhydride (PTCDA), naphthalene tetracarboxylic acid di-anhydride (NTCDA) may be used. Further, the semiconductor material can be a polymer, for example p-type materials like poly(3-hexylthiophen-2,5-diyl) (P3HT), DIPs-pentacene, poly[2,5-bis(3-alkylthiophen-2-yl)thieno(3,2-b)thiophene] (PBTTT) or n-type materials like poly{[N,N9-bis(2-octyl-dodecyl)-naphthalene-1,4,5,8-bis(dicarboximide)-2,6-diyl]-alt-5,59-(2,29-bithiophene)} (P(NDI2OD-T2).

In an embodiment the individual layers of the layer stack are deposited one after another by vacuum deposition, spin coating, printing, casting, slot-die coating, Langmuir-Blodgett (LB) deposition, or the like. When the individual layers of the layer stack are formed by vacuum deposition, the deposition conditions may vary according to the compound used to form the individual layers, and their desired structure and thermal properties. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

In an embodiment the layer stack is comprised in an OLED.

In another embodiment the layer stack is comprised in an OLED, wherein the CGL comprises the at least one redox-doped layer.

In another embodiment the layer stack is comprised an OLED, wherein the at least one redox-doped layer is the HIL.

In another embodiment the layer stack is comprised in an OLED, wherein the at least one redox-doped layer is the EIL.

In another embodiment the layer stack is comprised in an organic solar cell.

In another embodiment the layer stack is comprised in an organic field-effect transistor.

In another embodiment the layer stack is comprised in a photodetector.

Unless explicitly mentioned else, the direction of the inventive layered structure and of the inventive organic electronic device is as follows. In terms of the disclosure, the substrate constitutes the bottom of the layered structure. The bottom layer of the layer stack (or in other words first layer of the layer stack) is that layer of the layer stack which is arranged closest to the substrate (i.e. on the grid). Likewise, the top layer of the layer stack (or the in other words last layer of the layer stack) is the layer furthest away from the substrate. The top of the layered structure is formed by that surface of the top surface layer of the layered structure furthest away from the substrate.

According to the disclosure, the optical density measured by absorption spectroscopy of the interconnected parts (i.e. the grid material) is higher than that of the open areas. The absorption of the grid material may be significantly higher than that of the open areas, in particular twice as high. The optical density may be ten times higher than that of the open areas. The optical density may be measured by a Spectrophotometer UV-2450 PC as provided by Shimadzu Scientific Instruments, Tokyo, Japan.

In accordance with the inventive method, irradiating of the light pulses onto the layered structure may be conducted from the top of the layered structure to the bottom thereof, i.e. through the layer stack towards the grid/the first electrode structure. However, the inventive irradiating is not limited to this direction. For example, if a transparent substrate is used (for example for preparing a bottom-emitting structure) irradiating can also be conducted from the bottom of the layered structure to the top thereof, i.e. through the substrate to the grid. Likewise, it may be provided that irradiating is performed from any angle or direction provided that the grid is indeed exposed to the light pulses.

In a further embodiment, the layer stack further comprises an emission layer. The emission layer does not contain a redox-dopant. Also, the emission layer does not contain an injection material.

In a further embodiment, the grid material comprises a photoresist. The photoresist may be a positive or a negative photoresist. A negative resist is a type of photoresist in which the portion of the photoresist that is exposed to light becomes insoluble to the photoresist developer. The unexposed portion of the photoresist is dissolved by the photoresist developer. A positive resist is a type of photoresist in which the portion of the photoresist that is exposed to light becomes soluble to the photoresist developer. The portion of the photoresist that is unexposed remains insoluble to the photoresist developer.

In an embodiment the negative photoresist comprises a poly-imide compound, for example provided by Asahi Glass Co., Ltd. Or Merck KGaA, Darmstadt, Germany or SU-8 as provided by MicroChem Corp., Westborough, USA.

In an embodiment the positive photoresist comprises a phenolic resin and a diazonaphthoquinone sensitizer or a polymethyl methacrylate (PMMA) compound, for example provided by Microchemicals GmbH, Ulm, Germany or Brewer Science, INC., Rolla, USA or JSR Micro, Inc., Sunnyvale, USA.

In a further embodiment, the layered structure further comprises a second electrode arranged on the top of the layer stack.

In an embodiment the second electrode is a cathode. The cathode electrode comprises at least one substantially metallic cathode layer comprising a first zero-valent metal selected from the group consisting of alkali metal, alkaline earth metal, rare earth metal, group 3 transition metal and mixtures thereof.

The term "substantially metallic" shall be understood as encompassing a metal which is at least partially in a substantially elemental form. The term substantially elemental is to be understood as a form that is, in terms of electronic states and energies and in terms of chemical bonds of comprised metals atoms closer to the form of an elemental metal, or a free metal atom or to the form of a cluster of metal atoms, then to the form of a metal salt, of an organometallic metal compound or another compound comprising a covalent bond between metal and non-metal, or to the form of a coordination compound of a metal. It is to be understood that metal alloys represent beside neat elemental metals, atomized metals, metal molecules and metal clusters, any other example of substantially elemental form of metals.

According to another aspect the substantially metallic cathode layer is free of a metal halide and/or free of a metal organic complex.

In another embodiment the second electrode structure is an anode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode. The anode electrode may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

In an embodiment the second electrode structure is transparent. In a further embodiment, it may be provided that the organic electronic device further comprises an encapsulation.

In a further embodiment, the layered structure further comprises a barrier layer arranged on top of the second electrode. The barrier layer may be transparent. By using a transparent barrier layer and a transparent second electrode irradiating according to the inventive method can be performed after finishing the organic electronic device.

In an embodiment the barrier layer may constitute the encapsulation.

In a further embodiment, irradiating is performed by using of a flash lamp. The flash lamp may be a Xenon or LED light source or a Laser source suitable for irradiating an area of >1 $cm^2$ with one radiation pulse. The flash lamp is not a scanning focused laser irradiating an area of <1 $cm^2$ per radiation pulse.

The flash lamp may be a Fluid cooled Xenon flash Lamp part P3775 as available from Heraeus Noblelight Ltd, Cambridge, UK.

In accordance with the disclosure, different ways of irradiating may be conducted to expose the layered structure to light pulses. In general, there are four different ways to conduct irradiating.

i) immediately after depositing the redox-doped layer on top of the grid or on top of that part of the layer stack formed before depositing the redox-doped layer;
ii) before deposition of the second electrode(s) in particular in case of non-transparent second electrode(s);
iii) after deposition of the second electrode(s) (in case of transparent second electrode(s)); or
iv) onto the final encapsulated device (in case that the encapsulation is transparent).

In an embodiment the irradiating onto the layered structure may be carried out through a shadow mask covering the first electrode areas in order to increase the resolution of the method.

In an embodiment the substrate comprising the layered structure is arranged above or below the source of the radiation during irradiation.

In another embodiment the substrate comprising the layered structure may slide or move above or below the source of the radiation during irradiation. This operation mode may be useful for large area substrates.

In a further embodiment, the total thickness of the layer stack may be more than 10 nm and less than 5000 nm. The total thickness of the layer stack may be more than 30 nm and less than 300 nm. The thickness of the grid may be larger than the thickness of the at least one redox-doped layer. The thickness of the grid may be more than 500 nm and less than 10000 nm.

The thickness of individual layers on a substrate may be measured by a profilometer Stylus Profiler DektakXT as provided by Bruker, Billerica, Mass., USA.

The thickness of individual layers may be measured on a cross-section of the layer stack by using electron microscopy. Scanning or transmission electron microscopy may be used.

A cross-section of the layer stack may be obtained by sample preparation commonly used for microelectronic devices such as focussed-ion beam (FIB) or ultramicrotome preparation, as in US2013110421.

In vacuum deposition the layer thickness may be monitored during the deposition process using quartz crystal microbalance (QCM) sensors.

In a further embodiment, (i) the at least one redox-doped layer consists of a redox-dopant, or (ii) the at least one redox-doped layer comprises a redox-dopant and a matrix material, the matrix material being a charge transport material, or (iii) the at least one redox-doped layer is a double layer consisting of a first layer consisting of an injection material and a second layer consisting of a charge transport material which may be redox-doped or undoped.

In the context of the present disclosure, the term "redox-doped" refers to a dopant which increases electrical conductivity of the layer. The p-type dopant and n-type dopant of the present disclosure are essentially non-emissive dopants. The term "essentially non-emissive" means that the contribution of the non-light-emitting dopant to the emission spectrum from the device is less than 10%, it may be less than 5% relative to the emission spectrum.

In this regard, it may be provided that the redox dopant is:
1. a p-type dopant selected from
   1.1. an organic or organometallic molecular dopant having a molecular weight of about 350 to about 1700 which may be selected from dimalonitrile compound, an aromatic/heteroaromatic nitrile compound, a fullerene derivative or a radialene derivative of formula 1, wherein $Ar_{1-3}$ are the same or different and independently selected from aryl or hetero-aryl;

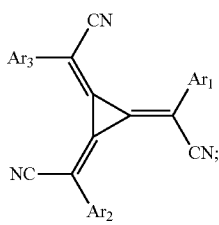

Formula 1 or
   1.2. a transition metal oxide, which may be selected from $MoO_3$ and $V_2O_5$; or
   1.3. a Lewis acid, which may be a (trifluoromethanesulfonyl)imide compound and may be selected from the bis(trifluoromethansulfanoyl)imides of a metal of groups 1 to 12 of the periodic system of elements. The metal of Groups 1 to 12 may be selected from Li, Mg, Ba, Sc, Mn, Cu, Ag or mixtures thereof Or;
2. an n-type dopant selected from
   2.1. an organic or organometallic molecular dopant having a molecular weight of about 300 to about 1500, or
   2.2. a metal dopant selected from the group consisting of a metal halide having a molecular weight of about 25 to about 500, a metal complex having a molecular weight of about 150 to about 1500, and a zero-valent metal selected from the group consisting of alkali metal, alkaline earth metal, and rare earth metals.

In an embodiment the redox dopant is a compound of formula 2:

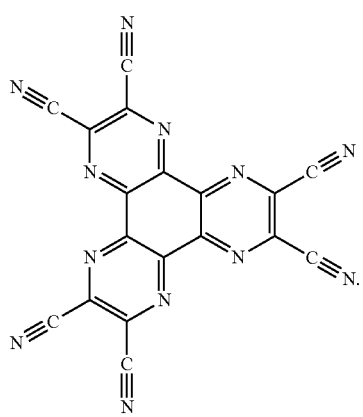

Formula 2

The term "molecular weight" or "molecular mass" is a physical property defined as the mass of a given molecule. The base SI unit for molecular weight is kg/mol. For historical reasons, molecular weights are almost always expressed in g/mol. So are they in this disclosure. The molecular weight may be calculated from standard atomic masses. It is the sum of all standard atomic masses in a compound. The standard elemental atomic masses are given in the periodic table of elements. Experimentally, the molecular weight may be determined by mass spectrometry, from the vapor density, freezing-point depression or boiling point elevation.

In another embodiment, the injection material is:
a p-type material selected from
1.1. an organic or organometallic molecular dopant having a molecular weight of about 350 to about 1700, which may be selected from dimalonitrile compound, an aromatic/heteroaromatic nitrile compound, a fullerene derivative or a radialene derivative of formula 1, wherein $Ar_{1-3}$ are the same or different and independently selected from aryl or heteroaryl;

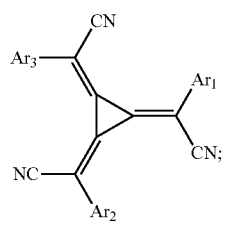

Formula 1 or
1.2. a transition metal oxide, which may be selected from $MoO_3$ and $V_2O_5$; or
1.3. a Lewis acid, which may be a (trifluoromethanesulfonyl)imide compound and may be selected from the bis(trifluoromethansulfanoyl)imides of metals of groups 1 to 12 of the periodic system of elements, the metal of Groups 1 to 12 may be selected from Li, Mg, Ba, Sc, Mn, Cu, Ag or mixtures thereof; or
1.4. a metal halide, which may be $MgF_2$ or;
2. an n-type material selected from
2.1. an organic or organometallic molecular dopant having a molecular weight of about 300 to about 1500, or
2.2. a metal dopant selected from the group consisting of a metal halide having a molecular weight of about 25 to about 500, a metal complex having a molecular weight of about 150 to about 1500, and a zero-valent metal selected from the group consisting of alkali metal, alkaline earth metal, and rare earth metals.

In an embodiment the injection material is a compound of formula 2

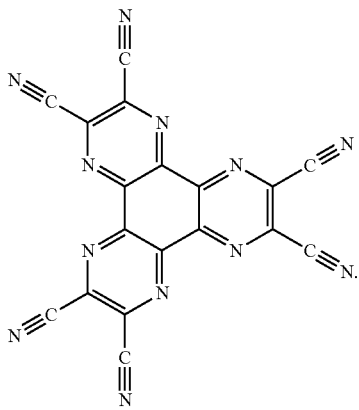

Formula 2

In another embodiment the injection material forms a self-assembled monolayer (SAM).

In a further embodiment, the electrode structure constitutes a variety of pixels on the substrate having a pixel gap of less than 50 μm. The pixel gap may be more than 1 μm and less than 30 μm. The pixel pitch is less than 150 μm. The pixel pitch may be more than 2 μm and less than 125 μm.

This embodiment particularly refers to a method for preparing an organic electronic device comprising a variety of organic light emitting diodes. Each of the organic light emitting diodes comprised in the organic electronic device may in this case be formed above one part of the first electrode structure. In this embodiment, a pixel is constituted by the first electrode structure in a way that the open areas of the grid are arranged above the electrode structure and, afterwards, the layer stack is arranged thereon. The pixel is then finalized by adding at least a second electrode structure to allow electrical connection.

The second electrode may be arranged in direct contact with the layer stack. There may be an interlayer between the second electrode and the layer stack.

The "pixel pitch" is commonly also called "dot pitch". It is the direct distance of pixels or subpixels like for instance the red, green and blue subpixels which constitute a display pixel or "dots" in the sense of smallest functional device elements as measured from the center of one pixel, sub-pixel or device element to the center of the next neighboring pixel or device element on regular arrays of pixels or device elements in microelectronics. Examples are sensor elements in image sensors or OLED pixels in AMOLED displays. The "pixel gap" can be also called "dot gap". It is the direct distance of pixels (or "dots" in the sense of smallest functional device elements) as measured from the edge of one pixel or device element to the closest edge of the next neighboring pixel or device element on regular arrays of pixels or device elements in microelectronics. Furthermore, the object is achieved by an organic electronic device obtainable by the inventive method. The organic electronic device according to the disclosure is different from the devices known in the art in that cross-talk between different parts of the first electrode structure through the non-electrode parts is reduced.

In a further embodiment, the organic electronic device is an OLED, a photodetector, a transistor or a solar cell.

Finally, the object is achieved by a device comprising the inventive organic electronic device. In this regard, it may be provided that the device is a display device.

In a further embodiment, the first electrode structure constitutes pixels of the display device.

All numeric values are herein assumed to be prefixed by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "does not contain" does not include impurities. Impurities have no technical effect with respect to the object achieved by the present disclosure.

EXPERIMENTAL PART

Figure 2:
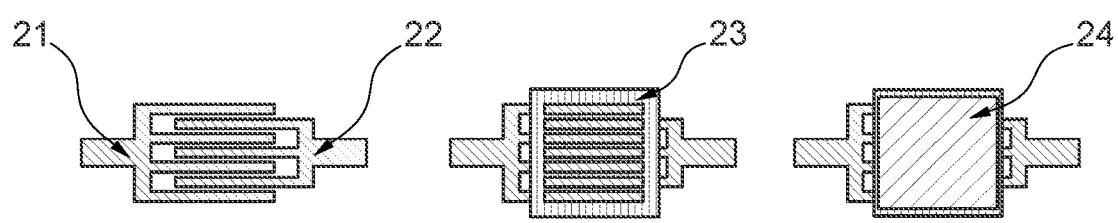
Figure 3:
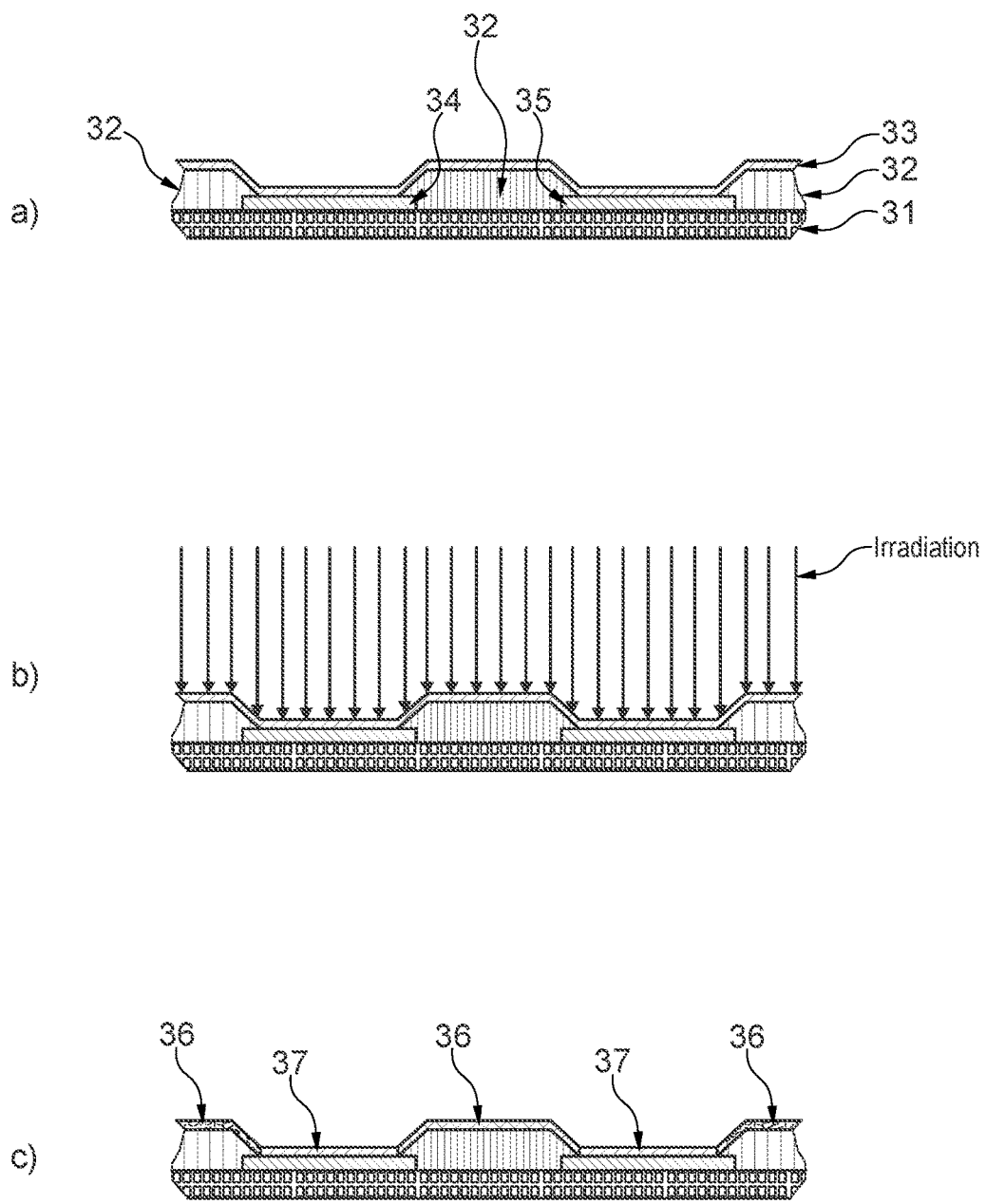

Following, the disclosure will be described in detail by referring to specific exemplary materials and conditions for performing the method by referring to the enclosed figures. In the figures show:

FIG. 1 Schematic view of the substrate with the layered structure placed under the fluid cooled Xenon flash lamp FIG. 2 Test layout for measurements of the cross-talk current FIG. 3 Schematic cross-sectional view of the layered structure a) before irradiation, b) with irradiation, c) after irradiation.

Figure 4:
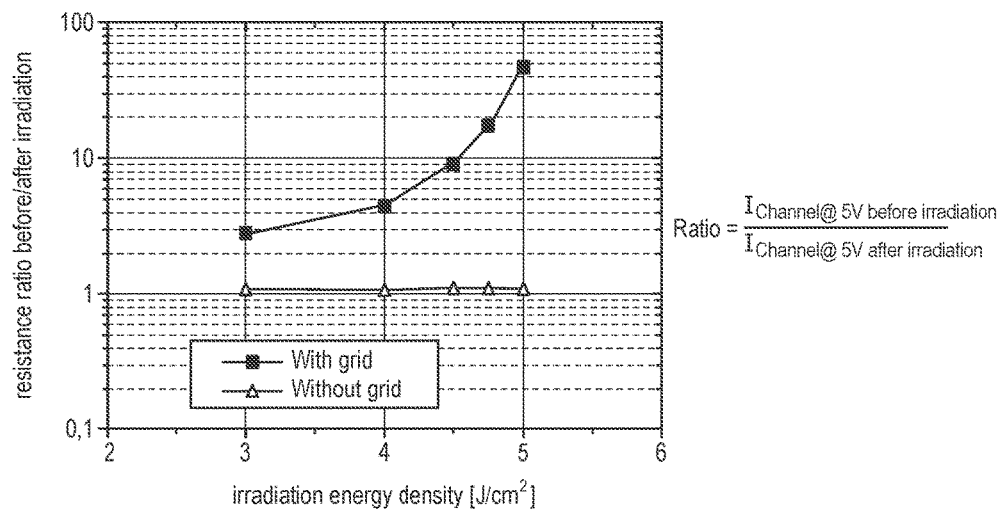

FIG. 4 Resistance ratio of the redox-doped layer with and without grid

Figure 5:
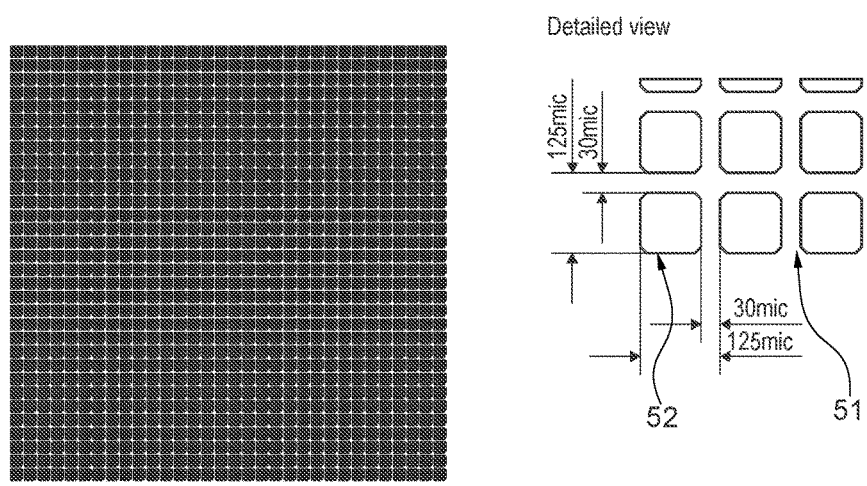

FIG. 5 Top view (large and detailed) of the grid on the substrate in a pixelated OLED layout FIG. 6 Cross-talk current ratio before and after irradiation FIG. 7 Optical density of grid vs first electrode Table 1 Cross-talk currents on test layout for 40 μm channel at 5V FIG. 1 shows a schematic view of the layered structure 10 being arranged below the source of the pulsed radiation 11 during irradiation at a distance of 25 mm. The layered structure 10 may be mounted on a sample holder 12. The method according to the disclosure utilizes light pulses based on single visible light flashes t≤2 ms. Thus, only little heat is introduced to the substrate, assuring temperature increase only locally and no heat dissipation and low thermal stress to non-irradiated areas.

FIG. 2 shows a schematic view of the test layout used to measure the cross-talk current between the first electrode of a first pixel 21 and the first electrode of a second pixel 22. The pixel gap on test layout corresponds to the direct smallest distance between first electrode of a pixel 21 and the first electrode of a second pixel 22. On this test layout this pixel gap is 40 μm which is very similar to real pixel gaps used for instance in AMOLED display production. The voltage used was 5 V. The currents were measured with a parameter analyzer Keithley S4200 as provided by Tektronix, Beaverton, USA. A robot was used to contact the electrodes. On top of the first electrode the 1.5 μm thick polyimide grid 23 was deposited using photolithographic process. The redox-doped layer 24 was a hole-injection layer (HIL). The HIL comprised the compounds

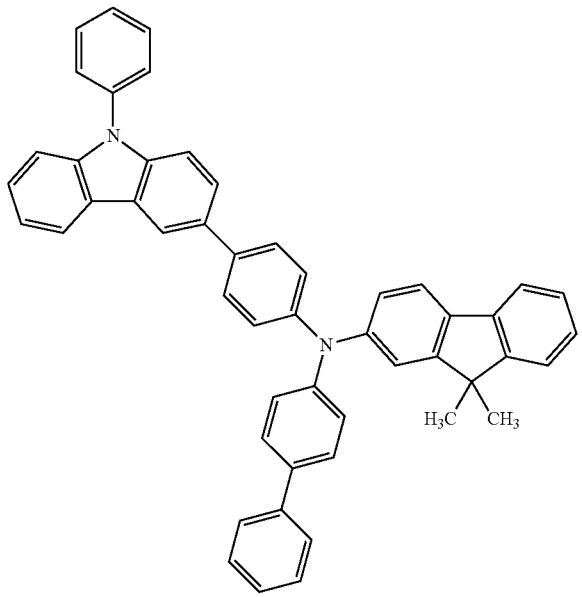 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

as charge transport material and

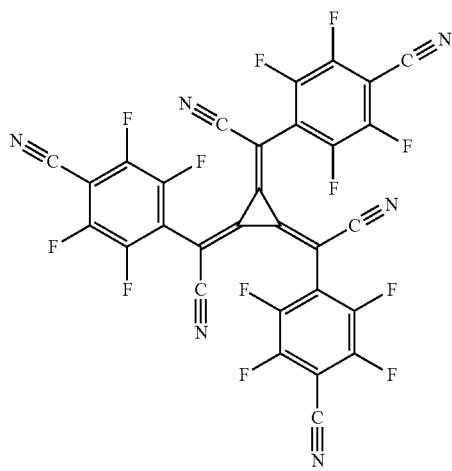 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

as redox dopant in the weight ratio of 92:8. The materials were co-deposited by vapor deposition. The layer thickness of the redox-doped layer was 10 nm.

FIG. 3 shows a schematic cross-sectional view of the layered structure a) before irradiation, b) with irradiation, c) after irradiation. The layered structure comprises a substrate 31, a grid material 32, a layer stack 33, a first electrode of a first pixel 34 and a first electrode of a second pixel 35. Before irradiation (FIG. 3a) the redox-doped layer in the layer stack has the same conductivity above the area of the first electrode and above the grid material of about 4E−5 S/cm, calculated as follows:

$$\text{Resistance} = \frac{5\,V}{I_{Channel@5\,V}}$$

$$b = \frac{\text{Resistance}}{\text{Channel length}}$$

$$\sigma = \frac{1}{b \cdot \text{Channel width} \cdot \text{Layer thickness}}$$

Channel width = 9.5 cm
Layer thickness = 10 nm
= 10e-7 cm
$\sigma_{before\ irradiation}$ = 4.09e-5 S/cm
$b$ = 257259 ohms/μm
= 2.57e9 ohms/cm After irradiation of the layered structure (FIG. 3c) is was surprisingly found that the redox-doped layer in the layer stack 33 has an unchanged conductivity above the area of the first electrode (layer stack area 37) whereas in the area above the grid material (layer stack area 36) the cross-talk current is significantly reduced. After irradiation cross-talk currents were very small (<100 pA). Therefore, conductivity could not be calculated in a meaningful way. The influence of the measurement setup (wire leakage current, noise) was dominating.

As a consequence of this, the cross-talk current which can flow through the redox-doped layer between the first electrode of a first pixel 34 and the first electrode of a second pixel 35 is also significantly reduced. The root cause of this effect is likely an interaction of the grid material with the irradiated light having an annihilating effect on the conductivity in the redox-doped layer in the layer stack 33. Due to the large aspect ratio of grid thickness vs thickness of the layer stack the effect does not significantly reduce the conductivity of the layer stack in layer stack area 37.

FIG. 4 shows the resistance ratios of the redox-doped layer on the test layout with grid and without grid for different irradiation energy densities. The resistance of the redox doped layer increases exponentially with irradiation energy density when the grid is used. At the same time the resistance of the redox-doped layer remains unchanged after irradiation if no grid is used.

FIG. 5 shows an example top view (large and detailed) of the grid, formed by a grid material 51 and having open areas 52, on an ITO substrate in a pixelated OLED layout. The pixel pitch is 125 μm and the pixel gap is 30 μm.

TABLE 1

Cross-talk currents on test layout for 40 μm channel at 5 V, redox-doped layer thickness 10 nm, current measured with S4200/robot

| Sample | Irradiation Pulse energy density [J/cm²] | Pulse length [ms] | current before treatment [nA] | current after treatment [nA] | Cross-talk current reduction ratio $I_{after}/I_{before}$ |
|---|---|---|---|---|---|
| Reference Example | 0 | 1 | 450.4 | 488.300 | 1/0.92 |
| Example 1 | 4 | 1 | 464.3 | 15.201 | 1/30.5 |
| Example 2 | 4.5 | 1 | 459.4 | 1.196 | 1/384 |
| Example 3 | 5 | 1 | 462.1 | 0.212 | 1/2185 |

Table 1 shows the measured cross-talk currents at 5 V on test layout for 40 μm channel which corresponds in this case to the pixel pitch. The reference example was not irradiated. The inventive example 1 was irradiated with a pulse energy density of 4 J/m², the inventive example 2 was irradiated with a pulse energy density of 4.5 J/m² and the inventive example 3 was irradiated with a pulse energy density of 5

J/m². Cross-talk current decreases significantly with pulse energy density showing a current reduction by more than a factor of 1000 for example 3. Already for example 2 the cross-talk current is reduced to <1 nA.

Figure 6:
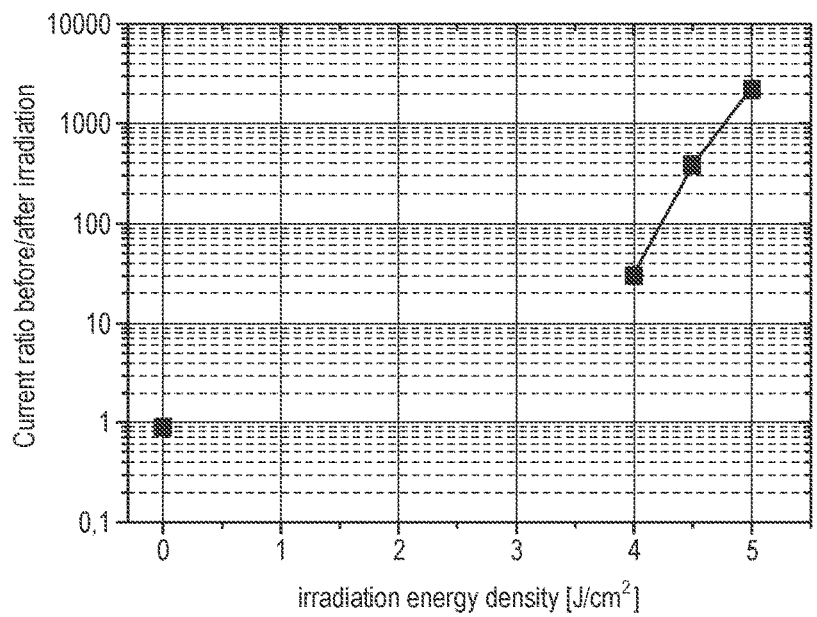

FIG. 6 depicts the values in Table 1 graphically.

Figure 7:
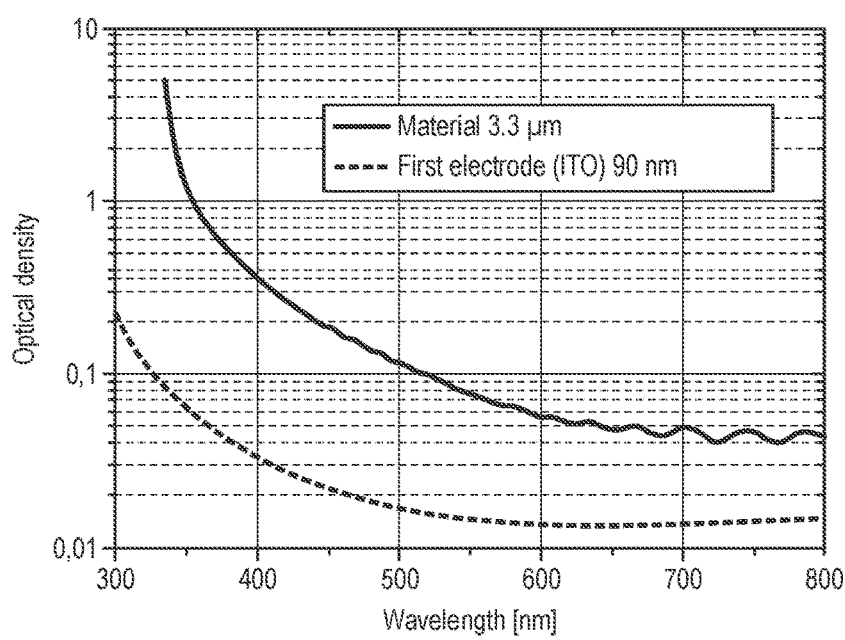

FIG. 7 shows the optical density of the grid material and the optical density of the first electrode. In the sense of this disclosure it is important that the optical density of the grid material is higher than the optical density of the first electrode to bring about the desired technical effect. Experimental results on reference example and examples 1-3 were obtained using a Xenon flash lamp. But any high power source with appropriate light spectrum capable of producing defined short pulses in millisecond range (e.g. LED) is suitable in the sense of this disclosure. The type and wavelength of the irradiation source is not particularly restricted or defined. Important is that the optical density of the grid material is higher than the optical density of the first electrode over a large usable wavelength range.

The features disclosed in the foregoing description, in the claims and the accompanying drawings may, both separately and in any combination, be material for realizing the disclosed method in diverse forms thereof.

The invention claimed is:

1. A method comprising the steps:
a) providing a layered structure applicable for preparing an organic electronic device, comprising:
aa) a substrate comprising a first electrode structure and a non-electrode part;
bb) a grid formed by a grid material, wherein open areas of the grid are arranged above at least a part of the first electrode structure and the grid material is arranged above at least a part of the non-electrode part; and
cc) a layer stack comprising at least one redox-doped layer having a conductivity of at least 1E−7 S/cm, the layer stack being deposited on the grid;
wherein the optical density measured by absorption spectroscopy of the grid material is higher than the optical density of the open areas; and
b) irradiating light pulses having a duration of <10 ms and an energy of 0.1 to 20 J/cm2 per pulse, onto the layered structure.

2. Method according to claim 1, wherein the layer stack further comprises an emission layer.

3. Method according to claim 1, wherein the grid material comprises a photoresist.

4. Method according to claim 1, wherein the layered structure further comprises a second electrode arranged on the top of the layer stack.

5. Method according to claim 4, wherein the layered structure further comprises a barrier layer arranged on top of the second electrode.

6. Method according to claim 1, wherein irradiating is performed by using of a flash lamp.

7. Method according to claim 6, wherein the flash lamp comprises a Xenon, LED, or Laser light source.

8. Method according to claim 1, wherein the total thickness of the layer stack is more than 10 nm and less than 5000 nm, and/or the thickness of the grid is larger than the thickness of the at least one redox-doped layer.

9. Method according to claim 8, wherein the total thickness of the layer stack is more than 30 nm and less than 300 nm.

10. Method according to claim 8, wherein the thickness of the grid is more than 500 nm and less than 10000 nm.

11. Method according to claim 1, wherein:
i. the at least one redox-doped layer consists of a redox-dopant; or
ii. the at least one redox-doped layer comprises a redox-dopant and a matrix material, the matrix material being a charge transport material; or
iii. the at least one redox-doped layer is a double layer consisting of a first layer consisting of an injection material and a second layer consisting of a charge transport material which may be redox-doped or undoped.

12. Method according to claim 11 wherein the redox dopant is:
1. a p-type dopant selected from
   1.1. an organic or organometallic molecular dopant having a molecular weight of about 350 to about 1700 and may be selected from dimalonitrile compound, an aromatic/heteroaromatic nitrile compound, a fullerene derivative or a radialene derivative of formula 1, wherein Arl-3 are the same or different and independently selected from aryl or heteroaryl;

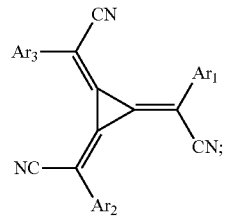

Formula 1 or
   1.2. a transition metal oxide, which may be selected from $MoO_3$ and $V_2O_5$; or
   1.3. a lewis acid, which may be a (trifluoromethanesulfonyl)imide compound and may be selected from the bis(trifluoromethansulfanoyl)imides of a metal of groups 1 to 12 of the periodic system of elements, wherein the metal of Groups 1 to 12 may be selected from Li, Mg, Ba, Sc, Mn, Cu, Ag or mixtures thereof Or;
2. an n-type dopant selected from
   2.1. an organic or organometallic molecular dopant having a molecular weight of about 300 to about 1500, or
   2.2. a metal dopant selected from the group consisting of a metal halide having a molecular weight of about 25 to about 500, a metal complex having a molecular weight of about 150 to about 1500, and a zero-valent metal selected from the group consisting of alkali metal, alkaline earth metal, and rare earth metals.

13. Method according to claim 11, wherein the injection material is:
1. a p-type material selected from
   1.1. an organic or organometallic molecular dopant having a molecular weight of about 350 to about 1700, which may be selected from dimalonitrile compound, an aromatic/heteroaromatic nitrile compound, a fullerene derivative or a radialene derivative of formula 1, wherein Arl-3 are the same or different and independently selected from aryl or heteroaryl;

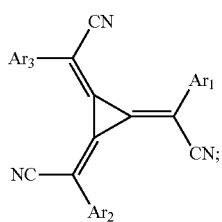

Formula 1 or
1.2. a transition metal oxide, which may be selected from $MoO_3$ and $V_2O_5$; or
1.3. a lewis acid, which may be a (trifluoromethanesulfonyl)imide compound and may be selected from the bis(trifluoromethansulfanoyl)imides of metals of groups 1 to 12 of the periodic system of elements, the metal may be selected from Li, Mg, Ba, Sc, Mn, Cu, Ag or mixtures thereof; or
1.4. a metal halide, which may be $MgF_2$
or;
2. an n-type material selected from
  2.1. an organic or organometallic molecular dopant having a molecular weight of about 300 to about 1500, or
  2.2. a metal dopant selected from the group consisting of a metal halide having a molecular weight of about 25 to about 500, a metal complex having a molecular weight of about 150 to about 1500, and a zero-valent metal of Groups 1 to 12 selected from the group consisting of alkali metal, alkaline earth metal, and rare earth metals.

14. Method according to claim 1, wherein the first electrode structure constitutes a variety of pixels on the substrate having a pixel gap of less than 50 μm, and a pixel pitch less than 150 μm.

15. Organic electronic device obtainable by a method according to claim 1.

16. Organic electronic device according to claim 15, wherein the organic electronic device is an OLED, a photodetector, a transistor or a solar cell.

17. Device according to claim 16, wherein the first electrode structure constitutes pixels of the display device.

18. Device comprising the organic electronic device according to claim 15.

19. Device according to claim 15, wherein the device is a display device.

20. Method according to claim 1, wherein the first electrode structure constitutes a variety of pixels on the substrate having a pixel gap of more than 1 μm and less than 30 μm, and a pixel pitch of more than 2 μm and less than 125 μm.

* * * * *